(12) United States Patent
Lin

(10) Patent No.: US 9,520,867 B2
(45) Date of Patent: *Dec. 13, 2016

(54) DUTY CYCLE DETECTION AND CORRECTION CIRCUIT IN AN INTEGRATED CIRCUIT

(71) Applicant: TAIWAN SEMICONDUCTOR MANUFACTURING COMPANY, LTD., Hsinchu (TW)

(72) Inventor: Mu-Shan Lin, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/724,226

(22) Filed: May 28, 2015

(65) Prior Publication Data

US 2015/0263716 A1 Sep. 17, 2015

Related U.S. Application Data

(63) Continuation of application No. 13/838,406, filed on Mar. 15, 2013, now Pat. No. 9,059,691.

(60) Provisional application No. 61/747,813, filed on Dec. 31, 2012.

(51) Int. Cl.
*H03K 5/04* (2006.01)
*H03K 5/156* (2006.01)
*H03K 3/017* (2006.01)

(52) U.S. Cl.
CPC ............ *H03K 5/1565* (2013.01); *H03K 3/017* (2013.01)

(58) Field of Classification Search
CPC .............................. H03K 5/1565; H03K 3/017
USPC .......................................................... 327/175
See application file for complete search history.

(56) References Cited

U.S. PATENT DOCUMENTS

| 7,567,106 | B2* | 7/2009 | Park et al. ..................... 327/175 |
| 7,633,324 | B2* | 12/2009 | Yun et al. ..................... 327/160 |
| 7,847,609 | B2* | 12/2010 | Shin ............................... 327/175 |
| 8,106,697 | B2* | 1/2012 | Chang et al. ................. 327/175 |
| 2004/0041609 | A1 | 3/2004 | Lin |
| 2004/0113668 | A1 | 6/2004 | Gaskins et al. |
| 2007/0075753 | A1 | 4/2007 | Parker et al. |
| 2007/0159224 | A1* | 7/2007 | Dwarka et al. ............... 327/175 |
| 2007/0290730 | A1 | 12/2007 | Dai et al. |
| 2009/0231006 | A1* | 9/2009 | Jang et al. .................... 327/175 |
| 2010/0026351 | A1 | 2/2010 | Lin |
| 2010/0301913 | A1* | 12/2010 | Li et al. ........................ 327/175 |
| 2011/0043260 | A1 | 2/2011 | Hart et al. |

(Continued)

*Primary Examiner* — Ryan Jager
(74) *Attorney, Agent, or Firm* — Hauptman Ham, LLP

(57) ABSTRACT

A clock generating circuit includes a clock generator, a first clock tree, a second clock tree, and a duty cycle correction circuit. The clock generator is configured to generate a first clock signal and a second clock signal. The first clock tree includes a driver cell configured to generate a first output clock signal based on the first clock signal and a set of control signals, and to generate a second output clock signal based on the second clock signal and the set of control signals. The second clock tree includes a driver cell configured to generate a third output clock signal based on the set of control signals. The duty cycle correction circuit is configured to receive the first output clock signal and the second output clock signal and to generate the set of control signal based on the first output clock signal and the second output clock signal.

23 Claims, 5 Drawing Sheets

(56) References Cited

U.S. PATENT DOCUMENTS

| | | |
|---|---|---|
| 2011/0050307 A1 | 3/2011 | Lin |
| 2011/0279159 A1 | 11/2011 | Lin |
| 2012/0169391 A1 | 7/2012 | Sofer et al. |
| 2013/0002324 A1 | 1/2013 | Lin |
| 2014/0002156 A1 | 1/2014 | Dwivedi et al. |
| 2015/0200674 A1* | 7/2015 | Chaivipas .................... 327/175 |

* cited by examiner

DUTY CYCLE DETECTION AND CORRECTION CIRCUIT IN AN INTEGRATED CIRCUIT

PRIORITY CLAIM

The present application is a continuation of U.S. application Ser. No. 13/838,406, filed Mar. 15, 2013, now U.S. Pat. No. 9,059,691, which claims the priority of U.S. Provisional Application No. 61/747,813, filed Dec. 31, 2012, the disclosures of which are incorporated herein by reference in their entireties.

BACKGROUND

In integrated circuit technology, digital systems are designed to operate based on clock signals. The clock signals are used to synchronize the operation of different components of the systems. The quality of the clock signals, including frequency, phase, amplitude and duty cycle, affects system performance.

A duty cycle of a clock signal is at 50% when a pulse width of a logic high pulse and a logic low pulse of a clock signal are equal to each other (i.e., have equal time intervals). The pulse widths together represent an operating frequency of the system clock. Systems operate based on the synchronization of rising and falling edges of the clock signal. If the duty cycle of the clock is not equal to 50%, the duty cycle is distorted and a timing of the operation of the components is affected. In some applications, duty cycle distortion affects performance of large scale systems, when adopting aggressive architecture such as double data rate (DDR) data architecture. A duty cycle correction circuit is typically used to adjust the duty cycle to 50%. An existing duty cycle correction method includes over-sampling a clock by using a higher frequency clock to compare the pulse width of the logic high pulse and logic low pulse of a clock signal. Another existing duty cycle correction method includes using a differential driving cell with an analog output integration circuit to differentiate between a pulse width of the logic high pulse and the logic low pulse.

BRIEF DESCRIPTION OF THE DRAWINGS

Reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are examples, and do not limit the scope of the disclosure.

One or more embodiments of the duty cycle detection and correction circuit and method of performing duty cycle detection and correction are applicable to application-specific integrated circuits among other applicable circuits, devices, and systems. One or more embodiments of the circuit and method provide automatic detection and correction of duty cycle distortion by performing phase alignment and by adjusting drive strength of a driver cell of a target clock tree.

Figure 1:
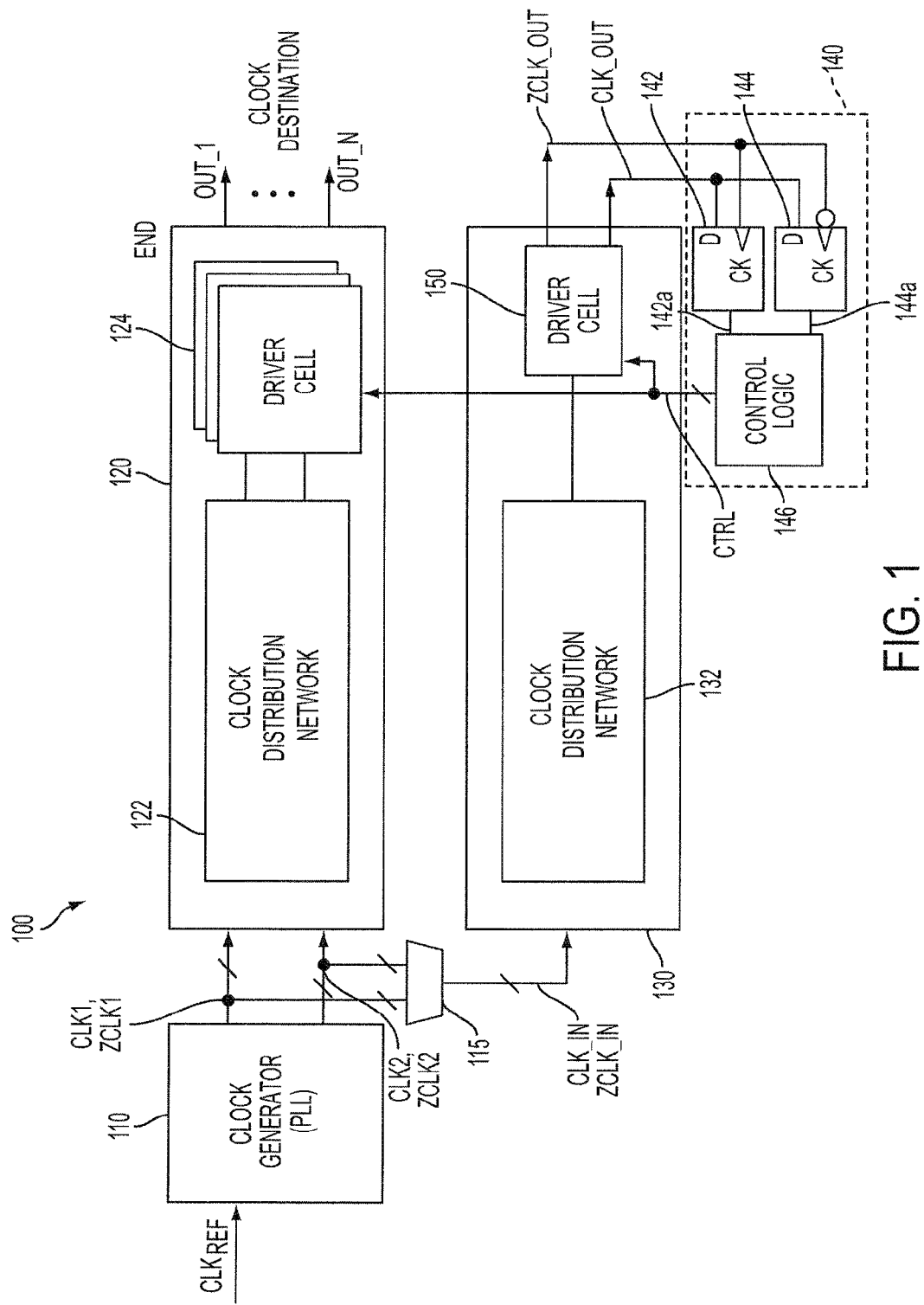
FIG. 1 is a block diagram of a duty cycle detection and correction circuit in accordance with one or more embodiments.

FIG. 1 is a block diagram of a clock generating circuit 100 including a duty cycle detection and correction circuit. The circuit 100 comprises a clock generator 110, a multiplexer 115, a target clock tree 120, a replica-based clock tree 130, and a duty cycle correction circuit 140 which is used to correct a duty cycle of clock signals input therein.

Clock generator 110 includes one or more outputs coupled with corresponding one or more inputs of the target clock tree 120. The multiplexer 115 includes one or more inputs coupled with the corresponding one or more outputs of the clock generator 110. An output of the multiplexer 115 is coupled with an input of the replica-based clock tree 130. The target clock tree 120 comprises a clock distribution network 122 and at least one driver cell 124. In the specific embodiment illustrated in FIG. 1, the target clock tree 120 comprises a plurality of driver cells 124. According to one or more embodiments, the clock distribution network 122 of the target clock tree 120 is a branching network that includes multiple branches of clock trees to fan out clock signals arriving at the input of the target clock tree 120. Each branch of the clock distribution network 122 uses one driver cell 124 for outputting clock signals to one or more clock destinations. The clock signals outputted by the driver cells 124 are collectively designated as OUT_1~OUT_N in FIG. 1 (N is an integer greater than 0) and define a clock signal output of the target clock tree 120. The clock distribution network 132 of the replica clock tree 130 includes a replica of at least one branch of the clock distribution network 122 of the target clock tree 120.

The clock generator 110 is configured to receive a reference clock signal $CLK_{REF}$ from a reference clock source. The clock generator 110 is further configured to generate a plurality of clock signals such as clock signal CLK1, ZCLK1, CLK2, and ZCLK2. According to one or more embodiments, the clock generator 110 is configured to generate clock signals having a clock frequency ranging from about 2 gigahertz (GHz) to 500 megahertz (MHz). In some embodiments, the clock signals CLK1 and ZCLK1 are a pair of inverted signals, and the clock signals CLK2 and ZCLK2 are a pair of inverted signals. In some embodiments, the clock generator 110 divides the reference clock signal $CLK_{REF}$ by four (4) to generate four (4) quadrature phase clock signals (e.g., CLK1, ZCLK1, CLK2, and ZCLK2), where the clock signals CLK1 and CLK2 have a 90-degree phase difference. In some embodiments, the clock signals CLK1 and CLK2 have a predetermined phase difference other than 90 degrees. According to one or more embodiments, the clock generator 110 is a phase-locked loop circuit (PLL). The multiplexer 115 is configured to select a pair of inverted clock signals, such as the pair of clock signals CLK1 and ZCLK1 or the pair of clock signals CLK2 and ZCLK2, to be input to the replica clock tree 130 (as the input signals CLK_IN and ZCLK_IN). In some embodiments, only CLK1 and ZCLK1 are output from the clock generator 110, and the multiplex 115 is omitted. In some embodiments, instead of selecting a pair of inverted clock signals to be input to the replica clock tree 130, only one clock signal is selected, and the replica clock tree 130 is capable of generating a pair of inverted clock signals in response to the selected clock signal.

The target clock tree 120 in some embodiments represents various types of clock trees that distribute a plurality of clock signals from a common point, i.e., the inputs of the target clock tree 120, to system components, i.e., clock destinations, as needed. The target clock tree 120 comprises the clock distribution network 122 and the plurality of driver cells 124. For example, in an integrated circuit, the clock distribution network 122 receives one or more clock signals CLK1, ZCLK1, CLK2, or ZCLK2 from the clock generator 110 and propagates the received clock signal(s) to corresponding driver cells 124. The driver cells 124 generate the clock signals OUT_1~OUT_N to be transmitted to the system components of the integrated circuit. However, because of the process variations and parasitic resistance and/or capacitance of the target clock tree 120, or many other factors, clock signals propagating through the target clock tree 120 are potentially subject to duty cycle distortions. In some embodiments, a set of control signals CTRL is generated by using the replica-based clock tree 130 and the duty cycle correction circuit 140. In some embodiments, the set of control signals CTRL is used to control the plurality of driver cells 124 in order to minimize the mismatch of duty cycle between the clock signals OUT_1~OUT_N at the output of the target clock tree 120 and corresponding clock signals CLK1, ZCLK1, CLK2, or ZCLK2, from which clock signals OUT_1~OUT_N are distributed and generated.

The replica-based clock tree 130 comprises a clock distribution network 132 and a driver cell 150. The driver cell 150 is coupled to the clock distribution network 132. The driver cell 150 outputs clock signals arriving at the input of the replica-based clock tree 130 and propagating through the clock distribution network 132 to the duty cycle correction circuit 140. In some embodiments, the driver cell 150 has a physical implementation the same as one of the plurality of driver cells 124. For simplicity, only one driver cell 150 of the replica-based clock tree 130 and corresponding portions of the duty cycle correction circuit 140 are illustrated in FIG. 1. In some embodiments, there are more than one driver cells 150 in the replica-based clock tree 130.

In some embodiments, the clock distribution network 132 has a physical implementation the same as a portion of the clock distribution network 122 (e.g., branches of the clock distribution network 122) corresponding to one of the plurality of driver cells 124 from which the driver cell 150 is duplicated. In some embodiments, the clock distribution network 132 has a physical implementation the same as the clock distribution network 122. The replica-based clock tree 130 is used in conjunction with the duty cycle correction circuit 140 for generating a set of control signals CTRL based on the output signals of the replica clock tree 130 CLK_OUT and ZCLK_OUT. The set of control signals is then used for controlling the driver cells 124 to correct duty cycle of the clock signals OUT_1 through OUT_N outputted by the target clock tree 120.

The duty cycle correction circuit 140 has an output coupled with a control input of the driver cell 150 and also coupled with a control input of one or more driver cells 124 to adjust drive strength of the driver cell 150 and the one or more driver cells 124, thereby adjusting the clock signal output of the target clock tree 120. The duty cycle correction circuit 140 comprises a first latch device 142, a second latch device 144, and a control logic circuit 146. Inputs of the first latch device 142 and the second latch device 144 are coupled to outputs CLK_OUT and ZCLK_OUT of the driver cell 150. Further, an output of the first latch device 142 and an output of the second latch device 144 are each coupled with an input of the control logic 146. Further, the control logic 146 generates the set of control signals CTRL and provides the set of control signals CTRL to the driver cell 150 and one or more of the driver cells 124 corresponding to the driver cell 150. The set of control signals CTRL generated by the control logic 146 usable to adjust duty cycle of clock signals outputted by the driver cell 150 is also used to adjust duty cycle of clock signals outputted by the one or more of the driver cell 124 corresponding to the driver cell 150.

The pair of inverted clock signals CLK_IN and ZCLK_IN propagate through the clock distribution network 132, and two corresponding output signals CLK_OUT and ZCLK_OUT are outputted by the driver cell 150. The output signals CLK_OUT and ZCLK_OUT are both input into the first latch device (e.g., a D flip flop) 142 and into the second latch device (e.g., another D flip flop) 144. The first latch device 142 and the second latch device 144 each comprise a data input (D) and a clock input (CK).

In one or more embodiments, in the first latch device 142, the output clock signal ZCLK_OUT is used to sample the output clock signal CLK_OUT. Further, in the second latch device 144, the inverse of output clock signal ZCLK_OUT is used to sample the output clock signal ZLK_OUT.

Output signals 142a and 144a of the first and second latch devices 142 and 144 are equal to either a logic "0" or a logic "1" depending on the clock signals CLK_OUT and ZCLK_OUT input to the first and second latch devices. Output signals 142a and 144a of the first and second latch devices 142 and 144 are then input into the control logic circuit 146. Control logic circuit 146 uses the output signals of the first and second latch devices 142 and 144 to generate the set of control signals CTRL. The set of control signals CTRL are used to adjust a pulse width of at least one of the output clock signals CLK_OUT or ZCLK_OUT, by controlling drive strength of the driver cell 150. The same set of control signals CTRL are also used to adjust a pulse width of at least one of the output clock signals OUT_1 through OUT_N by controlling driving strength of the corresponding one or more of the driver cells 124. In some embodiments, the clock signals at the clock signal output OUT_1 through OUT_N are thus duty cycle distortion-free.

Figure 2:
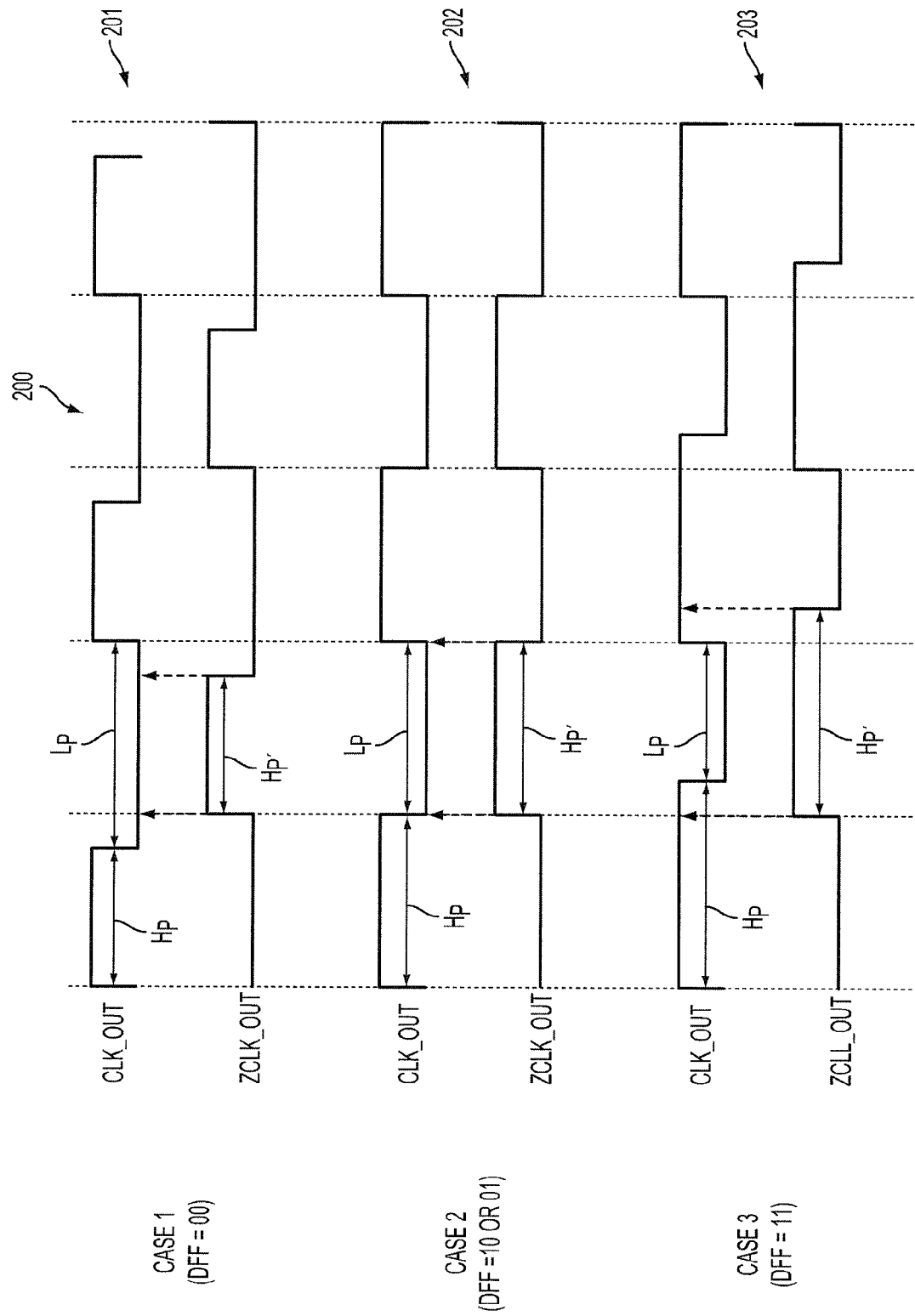
FIG. 2 is a timing diagram of comparison cases between pulse widths of a logic high pulse and a logic low pulse of phase clock signals in accordance with one or more embodiments.

FIG. 2 is a timing diagram 200 of a comparison between pulse widths of output clock signals CLK_OUT and ZCLK_OUT in accordance with one or more embodiments. The timing diagram 200 includes three timing diagrams 201 through 203. Each of the timing diagrams corresponds to one of three different comparison cases between the pulse widths of the logic high pulse Hp and the logic low pulse Lp of output clock signal CLK_OUT. Also, the clock signals CLK_IN and ZCLK_IN are a pair of inverted signals passing through the same clock distribution network 132. As a result, corresponding output clock signals CLK_OUT and ZCLK_OUT are subjected to similar distortion caused by the same clock distribution network 132. As such, in the embodiment depicted in FIG. 2, output clock signal ZCLK_OUT is considered to have a waveform similar to that of output clock signal CLK_OUT, only 180-degree phase-shifted. Accordingly, the logic high pulse Hp' of output clock signal ZCLK_OUT is used to as a 180-degree phase-shifted replica of the logic high pulse Hp of output clock signal CLK_OUT. The comparison of the logic high pulse Hp of output clock signal CLK_OUT and the logic low pulse Lp of output clock signal CLK_OUT is then made by comparing the logic high pulse Hp' of output clock signal ZCLK_OUT and the logic low pulse Lp of output clock signal CLK_OUT.

As shown in Case 1 in timing diagram 201, the pulse width of the logic high pulse Hp is less than the pulse width of the logic low pulse Lp (i.e., logic high pulse<logic low pulse). As shown in Case 2 in timing diagram 202, the pulse width of the logic high pulse Hp is substantially equal to the pulse width of the logic low pulse Lp (i.e., logic high pulse≅(approximately equal to) logic low pulse) which is 50% duty cycle. As shown in Case 3 in timing diagram 203, the pulse width of the logic high pulse Hp is greater than the pulse width of the logic low pulse Lp (i.e., logic high pulse>logic low pulse).

In Cases 1, 2 and 3, use of two output clock signals CLK_OUT and ZCLK_OUT as input signals of the first and second latch devices 142 and 144 (shown in FIG. 1) results in two output signals 142a and 144a of the first and second latch devices 142 and 144. For example, the rising edge of high pulse Hp' of the output clock signal ZCLK_OUT triggers the latch device 142 to sample the logic state of the output signal CLK_OUT, and the falling edge of high pulse Hp' of the output clock signal ZCLK_OUT triggers the latch device 144 to sample the logic state of the output signal CLK_OUT.

In Case 1, where the logic high pulse<logic low pulse, the output signals 142a and 144a are both equal to logic '0' (i.e., the outputs of the latch devices (e.g., D-Flip Flops) 142, 144 are both zero). This situation is referred to herein by a binary code DFF=00, and the duty cycle of signal CLK_OUT is smaller than 50%. In this disclosure, each the two bits of the DFF code refers to a corresponding one of the outputs signals 142a and 144a of the latch devices 142 and 144.

In Case 2, where the logic high pulse≅logic low pulse, one of the output signals 142a and 144a is equal to logic '1', whereas the other output signal 144a or 142a is equal to logic '0'. This situation is referred to herein by a binary code DFF=10 or DFF=01, and the duty cycle of signal CLK_OUT is substantially equal to 50%.

In Case 3, where the logic high pulse>logic low pulse, the output signals 142a and 144a are both equal to logic '1'. This situation is referred to herein by a binary code DFF=11, and the duty cycle of signal CLK_OUT is greater than 50%.

Figure 3:
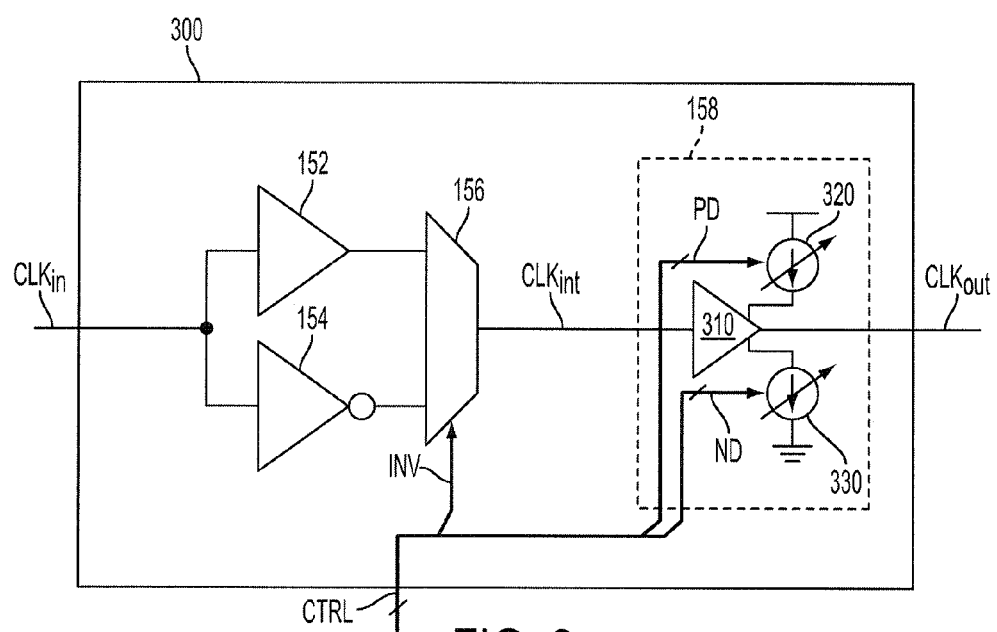
FIG. 3 is a block diagram of a driver cell of a replica-based clock tree of FIG. 1 in accordance with one or more embodiments.

FIG. 3 is a block diagram of a driver cell 300 in accordance with one or more embodiments. In some embodiments, the driver cell 300 constitutes a half of the driver cell 150 for generating the output clock signal CLK_OUT corresponding to the input clock signals CLK_IN, whereas the other half of the driver cell 150 is for generating the output clock signal ZCLK_OUT corresponding to the input clock signals ZCLK_IN. In one or more embodiments, the other half of the driver cell 150 includes a driver cell similar to the driver cell 300. In some embodiments, the driver cell 150 is capable of generating the output clock signal ZCLK_OUT by phase-shifting the clock signal CLK_OUT by 180 degrees.

The driver cell 300 includes a first delay cell 152 and a second delay cell 154. According to one or more embodiments, the first delay cell 152 is a buffer cell and the second delay cell 154 is an inverter cell. The first and second delay cells 152 and 154 each receive an input clock signal CLKin which is either a distorted version (after passing through the clock distribution network 132) of the input clock signal CLK_IN or the a distorted version of the input clock signal ZCLK_IN. In some embodiments, the two delay cells 152 and 154 delay the corresponding signals for a same delay. The driver cell 300 further includes a multiplexer 156 coupled to the outputs of the first and second delay cells 152 and 154. The multiplexer 156 selects one of the output signals from the first and second delay cells 152 and 154 as the output signal CLKint of the multiplexer 156 in response to an inverse control signal INV. The inverse control signal INV is a part of the set of control signals CTRL in FIG. 1. In the following description, a binary code INV=0 indicates that the multiplexer 156 selects the output of the delay cell 152, and a binary code INV=1 indicates that the multiplexer 156 selects the output of the delay cell 154.

The driver cell 300 further includes a driving circuit 158 which includes a driving unit 310, a pull-up adjusting circuit 320, and a pull-down adjusting circuit 330. The pull-up adjusting circuit 320 and pull-down adjusting circuit 330 have drive strengths adjustable by a corresponding set of adjustment signals PD or ND. The sets of control signals PD and ND are also parts of the set of control signals CTRL in FIG. 1. The driving unit 310 is connected to the pull-up adjusting circuit 320 and pull-down adjusting circuit 330 and generates an output signal CLKout. The pull-up adjusting circuit 320 and pull-down adjusting circuit 330 are configured to provide pull up/pull down paths to the driving unit 310. The term "pull-up" refers to causing an output signal to transition from a logic low level to a logic high level. The term "pull down" refers to causing an output signal to transition from a logic high level to a logic low level. The output clock signal CLKout is a duty-cycle-adjusted signal of the input clock signal CLKin. The output clock signal CLKout is inputted to the corresponding inputs of the first and second latch devices 142 and 144 (shown in FIG. 1).

For example, when the input signal CLKin, such as the output signal from the clock distribution tree 132 and corresponding to the clock signal CLK_IN, is received, the output clock signal CLKout is a duty-cycle-adjusted version of CLKin and usable as the output clock signal CLK_OUT. Similarly, when the output signal from the clock distribution tree 132 and corresponding to the clock signal ZCLK_IN is received as the input clock signal CLKin, the output clock signal CLKout is a duty-cycle-adjusted version of CLKin and usable as the output clock signal ZCLK_OUT.

In some embodiments, the pull-up adjusting circuit 320 includes a plurality of switches to enable one or more PMOS transistors in the driving unit 310 in response to the set of adjustment signals PD. In some embodiments, the pull-down adjusting circuit 330 includes a plurality of switches to enable one or more NMOS transistors in the driving unit 310 in response to the set of adjustment signals ND.

In some embodiments, the pull-up adjusting circuit 320 includes a plurality of current sources and a plurality of switches to enable one or more of the plurality of current sources the pull-up adjusting circuit 320 in response to the set of adjustment signals PD. In some embodiments, the pull-down adjusting circuit 330 includes a plurality of current sources and a plurality of switches to enable one or more of the plurality of current sources of the pull-down adjusting circuit 330 in response to the set of adjustment signals ND.

In some embodiments, the pull-up adjusting circuit 320 includes a transistor working as a current source and a biasing circuit to provide various biasing voltage to the transistor in response to the set of adjustment signals PD. In some embodiments, the pull-down adjusting circuit 330 includes a transistor working as a current source and a biasing circuit to provide various biasing voltage to the transistor in response to the set of adjustment signals ND.

Each of the one or more driver cells 124 in FIG. 1 corresponding to the driver cell 150 includes a driving circuit similar to the driving circuit 158 and receives the set of adjustment signals INV, PD, and ND from the control logic 146. Therefore, when the duty cycles of output clock signals CLK_OUT and ZCLK_OUT are corrected at the driver cell 150, duty cycles of the output clock signals OUT_1 through OUT_N are also corrected at the one or more driver cells 124 corresponding to the driver cell 150.

Figure 4:
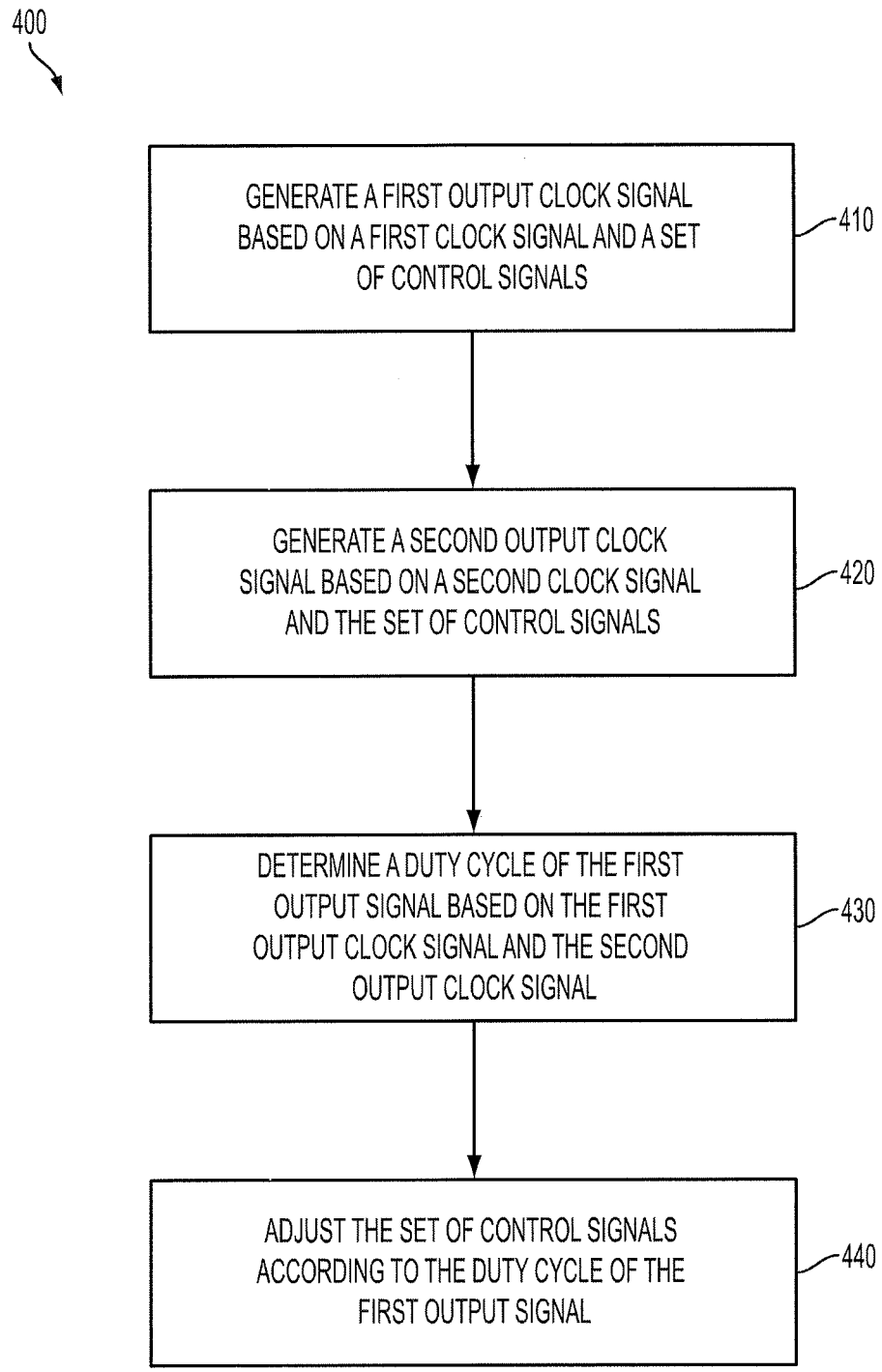
FIG. 4 is a flowchart of a method of duty cycle correction method in accordance with one or more of embodiments.

FIG. 4 is a flowchart of a method of duty cycle correction in accordance with one or more of embodiments. It is understood that additional processes may be performed before, during, and/or after the method 400 depicted in FIG. 4, and that some other processes may only be briefly described herein. A person having ordinary skill in the art would also appreciate that, in some embodiments, one or more of the operations depicted in FIG. 4 are omitted.

As depicted in FIG. 4 and FIG. 1, in operation 410, the replica-based clock tree 130 receives a first clock signal CLK_IN and generates a first output clock signal CLK_OUT based on the first clock signal CLK_IN and a set of control signals CTRL. Also, in operation 420, the replica-based clock tree 130 receives a first clock signal CLK_IN and generates a second clock signal ZCLK_IN and generates a second output clock signal ZCLK_OUT based on the first clock signal CLK_IN and the set of control signals CTRL. In some embodiments, the first clock signal CLK_IN and the second clock signal ZCLK_IN have a predetermined phase difference. In some embodiments, the first and second phase clock signals CLK_IN and ZCLK_IN have a 180-degree phase difference.

The process then proceeds to operation 420, where the duty cycle correction circuit 140 determines a duty cycle of the first output signal CLK_OUT based on the first output clock signal CLK_OUT and the second output clock signal ZCLK_OUT. In some embodiments, the duty cycle correction circuit 140, by using the first latch 142, samples the first output signal CLK_OUT based on the second output signal ZCLK_OUT. The second latch 142 then generates a first logic output signal. In some embodiments, the duty cycle correction circuit 140, by using the second latch 144, further samples the first output signal CLK_OUT based an inverse of the second output clock signal ZCLK_OUT. The second latch 144 then generates a second logic output signal. In some embodiments, the first and second logic signals are collectively referred to as a binary code DFF denoted by a two digit number, where each digit refers to a logic value of the first logic output signal or the second logic output signal.

In some embodiments, the binary code DFF is indicative of a duty cycle of the output clock signal CLK_OUT. For example, as depicted in FIG. 2, in some embodiments, DFF=00 when the logic high pulse<logic low pulse (Case 1 in FIG. 2), and DFF=11 when the logic high pulse>logic low pulse (Case 3 in FIG. 2). In some embodiments, DFF=01 or 10 refers to a situation that the duty cycle of the output clock signals CLK_OUT and ZCLK_OUT is about 50% and are deemed acceptable (Case 2 in FIG. 2).

The process then proceeds to operation 440, where the set of control signals CTRL is adjusted according to the duty cycle of the first output clock CLK_OUT. In some embodiments, when DFF=11, the ND is increased in order to increase the pull-down capability of the driver cell 150. In some embodiments, when DFF=00, the PD is decreased in order to decrease the pull-up capability of the driver cell 150.

Figure 5:
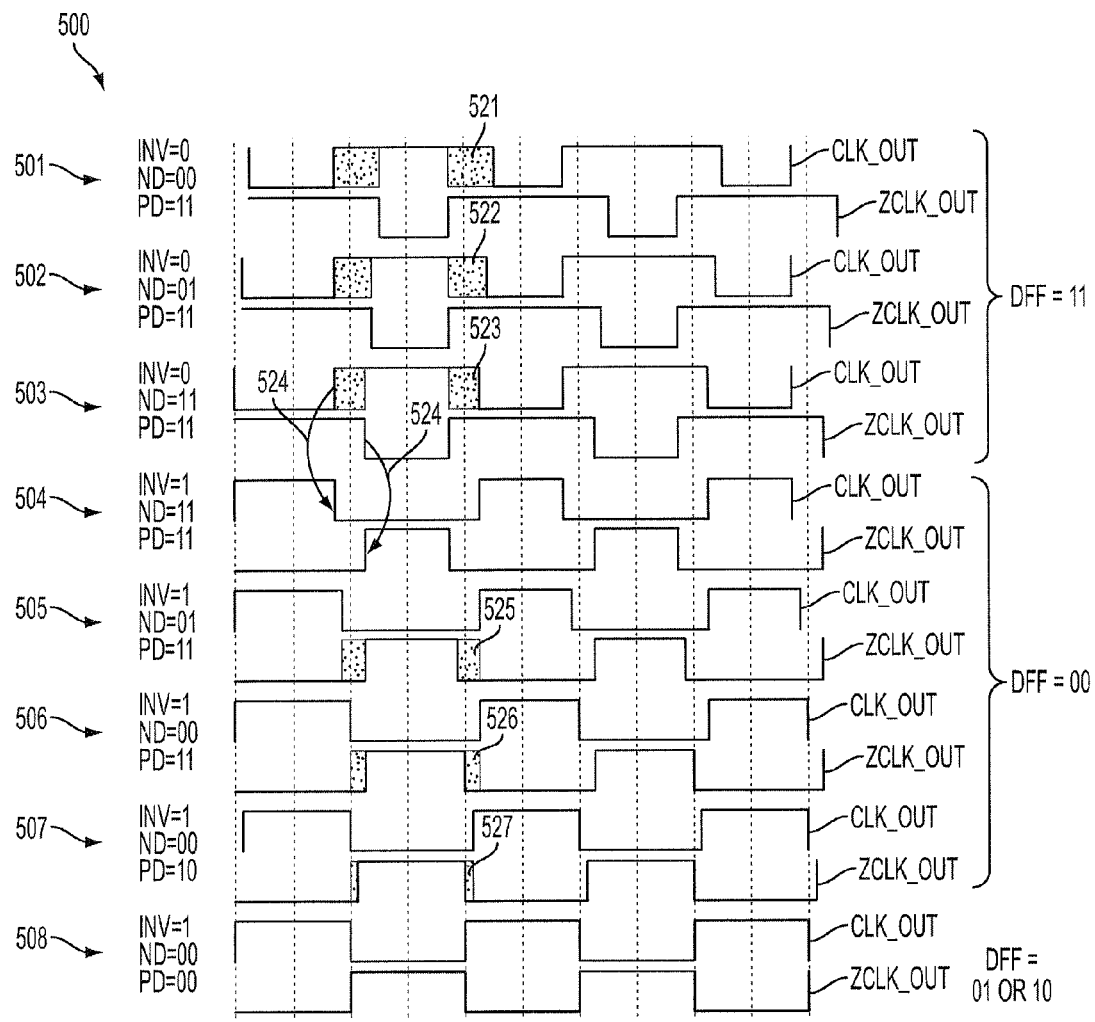
FIG. 5 is a timing diagram of performing duty cycle correction based on a correction algorithm in accordance with one or more embodiments.

FIG. 5 is a timing diagram 500 that includes eight (8) timing diagrams 501 through 508. FIG. 5 depicts an example case of duty cycle correction with the assumption that the logic high pulse of the output clock signal CLK_OUT is greater than the logic low pulse (Case 3 as depicted in FIG. 2).

In the following non-limiting example, the set of control signals PD includes two binary signals representing a binary code. The pull-up adjusting circuit 320 causes the driving circuit 158 to have a first pull-up capability when the set of control signals PD corresponds to a binary code "00" (i.e., PD=00), a second pull-up capability greater than the first pull-up capability when PD=10, and a third pull-up capability greater than the second pull-up capability when PD=11. The pull-down adjusting circuit 330 causes the driving circuit 158 to have a first pull-down capability when ND=00, a second pull-down capability greater than the first pull-down capability when ND=10, and a third pull-down capability greater than the second pull-down capability when ND=11. In some embodiments, there are other arrangements with respect to the mapping of driving capability of pull-up adjusting circuit 320 and/or pull-down adjusting circuit 330 and corresponding codes or values of control signals PD and/or ND.

Also, in the following non-limiting examples, PD is initially set to be 11, ND is initially set to be 00, and INV is initially set to be 0.

The control logic 146 further performs correction of the duty cycle distortion by adjusting (e.g., increasing or decreasing) the binary codes of the pull-up adjusting circuit 320 and the pull-down adjusting circuit 330, in order to increase or decrease the driving strength of the driver cell 300 and to, therefore, adjust a pulse width of the output clock signals CLK_OUT and ZCLK_OUT.

In the first timing diagram 501, if the logic high pulse of output clock signal CLK_OUT is greater than the logic low pulse of output clock signal CLK_OUT, the control logic 146 receives code DFF=11 from the latch devices 142 and 144. Also, PD is initially set to be 11, ND is initially set to be 00, and INV is initially set to be 0. A difference in pulse width between the logic high pulse and the logic low pulse is indicated by region 521.

According to an embodiment, as shown in the timing diagram 502, the pull-down driving strength of the driving circuit 158 is increased by setting ND from '00' to '01'. As a result, the pulse width of the logic high pulse is increased, and the difference in pulse width between the logic high pulse and the logic low pulse is reduced, as indicated by region 522. The duty cycle is improved compared to the situation at the timing diagram 501. However, because the logic high pulse of output clock signal CLK_OUT is still greater than the logic low pulse of output clock signal CLK_OUT, the code DFF remains at '11'.

Next, in the timing diagram 503, the pull-down driving strength of the driving circuit is further increased by setting ND to a binary code of '11'. As a result, the pulse width of the logic high pulse is further increased, and the difference in pulse width between the logic high pulse and the logic low pulse is further reduced, as indicated by region 523. The duty cycle is further improved compared to the situation at the timing diagram 502. However, because the logic high pulse of output clock signal CLK_OUT is still greater than the logic low pulse of output clock signal CLK_OUT, the code DFF remains at '11'.

When the binary code of ND is equal to '11', according to the example depicted in FIG. 5, the driving strength of the pull-down adjusting circuit 330 can no longer be increased.

Meanwhile, if the binary code defined by the output signals 142a and 144a of the first and second latch devices 142 and 144 equals DFF=11, the inverse bit INV is changed from '0' to '1' (i.e., INV=1) to invert the clock signal selection at the multiplexer 156. As a result, the clock signals CLK_OUT and ZCLK_OUT are inverted as shown by arrows 524 in FIG. 5. The binary code defined by the output signals 142a and 144a then changes to '00' (i.e., DFF=00). In some embodiments, compared with a configuration without the inverting feature, inverting the clock signals CLK_OUT and ZCLK_OUT equivalently doubles the number of adjustable levels of the driving strength of the pull-up adjusting circuit 320 and/or the pull-down adjusting circuit 330.

With the change of the binary code DFF to '00', the set of control signals PD and ND are adjusted to gradually decrease the pull-down driving capability or the pull-up driving capability of the driving circuit 158 until the binary code DFF changes to '01' or '01'.

Specifically, in the timing diagram 505, the binary code of ND is set to '01'. As a result, the difference in pulse width between the logic high pulse and the logic low pulse is further reduced, as indicated by region 525. The duty cycle is further improved compared to the situation at the timing diagram 503. Because the logic low pulse of inversed output clock signal CLK_OUT is now greater than the logic high pulse of inversed output clock signal CLK_OUT, the code DFF remains at '00'.

In the timing diagram 506, the pull-down driving strength of the driving circuit 158 is decreased by further setting binary code of ND to binary code of '00'. As a result, the difference in pulse width between the logic high pulse and the logic low pulse is further reduced, as indicated by region 526. The duty cycle is further improved compared to the situation at the timing diagram 505. Because the logic low pulse of inversed output clock signal CLK_OUT is still greater than the logic high pulse of inversed output clock signal CLK_OUT, the code DFF remains at '00'.

In the timing diagram 507, because ND has been set to '00', the pull-down driving strength of the driving circuit 158 can no longer be decreased. Therefore, the pull-up driving strength of the driving circuit 158 is decreased by setting a binary code of PD to '10'. As a result, the difference in pulse width between the logic high pulse and the logic low pulse is further reduced, as indicated by region 527. The duty cycle is further improved compared to the situation at the timing diagram 506. Because the logic low pulse of inversed output clock signal CLK_OUT is still greater than the logic high pulse of inversed output clock signal CLK_OUT, the code DFF remains at '00'.

In the timing diagram 508, pull-up driving strength of the driving circuit 158 is further decreased by setting a binary code of PD to '00'. As a result, the difference in pulse width between the logic high pulse and the logic low pulse is further reduced, and the duty cycle is corrected and equals to about 50%. As a result, code DFF is now at '10' or '01'.

The timing diagram in FIG. 5 illustrates a situation when the 50% duty cycle is reached. In some embodiments, if the binary code of DFF=10 or DFF=01 is reached at any earlier stage as represented by diagrams 501 through 507, the duty cycle correction is ended. In addition, it is possible that the control logic 146 starts the algorithm at a state corresponding to any state (as represented by any one of diagrams 501-508) of PD/ND described with respect to FIG. 5.

The duty cycle correction process as depicted in FIG. 5 is summarized in the form of a set of pseudo code as follows:

If DFF=11 and ND=00, then the binary code of the set of control signals ND is increased;
If DFF=11 and ND=11, set INV=1;
If DFF=00 and ND=11 and INV=1 and PD=11, then the binary code of the set of control signals ND is decreased;
If DFF=00 and ND=00 and INV=1 and PD=11, then the binary code of the set of control signals PD is decreased; and
If DFF=01 or 10, then the duty cycle correction is ended.

In some embodiments, for clock signals where the logic low pulse>logic high pulse (Case 1), the binary codes of the first and second latch devices 142, 144 (e.g., DFF code), the sets of control signals for the pull-up and pull-down adjusting circuits 160, 162 (e.g., PD and ND), and the inverse signal INV are changed according to an algorithm summarized in the form of a set of pseudo code as follows:

If DFF=00 and PD=11, then the binary code of the set of control signals PD is decreased;
If DFF=00 and PD=00, set INV=1;
If DFF=11 and PD=00 and INV=1 and PD=00, then the binary code of PD is increased;
If DFF=11 and PD=11 and INV=1 and PD=00, then the binary code of ND is increased; and
If DFF=01 or 10, then the duty cycle correction is ended.

In some embodiments, the duty cycle correction circuit 140 is enabled at all times during operation of the clock generating circuit 100, for real-time duty cycle correction. In some embodiments, the duty cycle correction circuit 140 is enabled at startup when the clock generating circuit 100 is initiated. In some embodiments, the duty cycle correction circuit 140 is enabled periodically or as required by the clock generating circuit 100 or as instructed by the integrated circuit in which the clock generating circuit 100 is equipped.

In one or more embodiments, a clock generating circuit includes a clock generator, a first clock tree, a second clock tree, and a duty cycle correction circuit. The clock generator is configured to generate a first clock signal and a second clock signal, and the first clock signal and the second clock signal have a predetermined phase difference. The first clock tree includes a driver cell configured to generate a first output clock signal based on the first clock signal and a set of control signals, and to generate a second output clock signal based on the second clock signal and the set of control signals. The second clock tree includes a driver cell configured to generate a third output clock signal based on the set of control signals. The duty cycle correction circuit is configured to receive the first output clock signal and the second output clock signal and to generate the set of control signal based on the first output clock signal and the second output clock signal.

In one or more embodiments, a method of generating clock signals includes generating by a first driver cell a first output clock signal based on a first clock signal and a set of control signals; and generating by the first driver cell a second output clock signal based on a second clock signal and the set of control signals. The first clock signal and the second clock signal have a predetermined phase difference. The method further includes determining a duty cycle of the first output clock signal based on the first output clock signal and the second output clock signal; adjusting the set of control signals according to the duty cycle of the first output clock signal; and generating by a second driver cell a third output clock signal based on the set of control signals.

In one or more embodiments, a clock generating circuit includes a first clock tree, a second clock tree, and a duty cycle correction circuit. The first clock tree is configured to receive a first clock signal and a second clock signal, to generate a first output clock signal based on the first clock signal and a set of control signals, and to generate a second output clock signal based on the second clock signal and the set of control signals. The first clock signal and the second clock signal have a first predetermined phase difference. The second clock tree is configured to receive a third clock signal and to generate a third output clock signal based on the third clock signal and the set of control signals. The third clock signal and the first clock signal have a second predetermined phase difference. The duty cycle correction circuit is configured to receive the first output clock signal and the second output clock signal and to generate the set of control signal based on the first output clock signal and the second output clock signal.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A clock generating circuit, the circuit comprising:
   a clock generator configured to generate a first clock signal and a second clock signal, the first clock signal and the second clock signal having a predetermined phase difference;
   a first clock tree comprising a driver cell configured to generate a first output clock signal based on the first clock signal and a set of control signals, and to generate a second output clock signal based on the second clock signal and the set of control signals;
   a second clock tree comprising a driver cell configured to generate a third output clock signal based on the first clock signal and the set of control signals; and
   a duty cycle correction circuit configured to receive the first output clock signal and the second output clock signal and to generate the set of control signals based on the first output clock signal and the second output clock signal.

2. The clock generating circuit of claim 1, wherein the duty cycle correction circuit comprises:
   a first latch device configured to sample the first output clock signal based on the second output clock signal; and
   a second latch device configured to sample the first output clock signal based on an inverse of the second output clock signal.

3. The clock generating circuit of claim 2, wherein the duty cycle correction circuit further comprises:
   a control logic circuit configured to receive a first logic output signal from the first latch device and a second logic output signal from the second latch device and, based on the first logic output signal and the second logic output signal, generate the set of control signals.

4. The clock generating circuit of claim 3, wherein the control logic circuit is configured to generate the set of control signals by increasing a binary code of the set of control signals corresponding to a pull-down adjusting circuit of the driver cell of the first clock tree responsive to the first logic output signal being a logic '1' and the second logic output signal being a logic '1' when an inverse control signal of the set of control signals is a logic '0'.

5. The clock generating circuit of claim 3, wherein the logic control circuit is configured to generate the set of control signals by decreasing a binary code of the set of control signals corresponding to a pull-down adjusting circuit of the driver cell of the first clock tree responsive to a first logic output signal being a logic '0' and the second logic output signal being a logic '0' when an inverse control signal of the set of control signals is a logic '1'.

6. The clock generating circuit of claim 3, wherein the control logic circuit is configured to generate the control signal by decreasing a binary code of the set of control signals corresponding to a pull-up adjusting circuit of the driver cell of the first clock tree responsive to the first logic output signal being a logic '0' and the second logic output signal being a logic '0' when an inverse control signal of the set of control signals is a logic '0'.

7. The clock generating circuit of claim 3, wherein the logic control circuit is configured to generate the control signal by increasing a binary code of the set of control signals corresponding to a pull-up adjusting circuit of the driver cell of the first clock tree responsive to the first logic output signal being a logic '1' and the second logic output signal being a logic '1' when an inverse control signal of the set of control signals is a logic '1'.

8. The clock generating circuit of claim 3, wherein the control logic circuit is configured to set an inverse control signal of the set of control signals from a logic '0' to a logic '1' responsive to a binary code of the set of control signals corresponding to a pull-up adjusting circuit of the driver cell of the first clock tree and a binary code of the set of control signals corresponding to a pull-down adjusting circuit of the driver cell of the first clock tree being "11" or "00".

9. The clock generating circuit of claim 1, wherein the driver cell of the first clock tree comprises:
a first delay cell and a second delay cell, wherein the first delay cell is a buffer cell configured to delay an input clock signal being either the first clock signal or second clock signal, and the second delay cell is an inverter cell configured to invert the input clock signal;
a multiplexer configured to select the delayed input clock signal or the inverted signal of the input clock signal in response to an inverse control signal; and
a driving circuit comprising a pull-up adjusting circuit and a pull-down adjusting circuit, the driving circuit coupled to receive the clock signal selected by the multiplexer, the pull-up adjusting circuit and the pull-down adjusting circuit adjustable based on the set of control signals.

10. The clock generating circuit of claim 1, wherein the first clock signal and the second clock signal are a pair of inverted signals.

11. The clock generating circuit of claim 1, wherein the duty cycle correction circuit is further configured to generate the set of control signals independently of the third output clock signal.

12. A method of generating clock signals, comprising:
generating by a first driver cell a first output clock signal based on a first clock signal and a set of control signals;
generating by the first driver cell a second output clock signal based on a second clock signal and the set of control signals, the first clock signal and the second clock signal having a predetermined phase difference;
determining a duty cycle of the first output clock signal based on the first output clock signal and the second output clock signal;
adjusting the set of control signals according to the duty cycle of the first output clock signal; and
generating by a second driver cell a third output clock signal based on the first clock signal and the set of control signals.

13. The method of claim 12, wherein determining the duty cycle of the first output clock signal based on the first output clock signal and the second output clock signal comprises:
sampling the first output clock signal based on the second output clock signal and generating a first logic output signal; and
sampling the first output clock signal based on an inverse of the second output clock signal and generating a second logic output signal.

14. The method of claim 13, wherein adjusting the set of control signals is performed based on the first logic output signal and the second logic output signal.

15. The method of claim 14, further comprising:
maintaining the set of control signals when the first logic output signal and the second logic output signal have different logic values.

16. The method of claim 14, wherein adjusting the set of control signals comprises:
increasing or decreasing binary codes of the set of control signals corresponding to a pull-up adjusting circuit or a pull-down adjusting circuit of the first driver cell when the first and second logic output signals have a same logic value.

17. The method of claim 14, wherein adjusting the set of control signals comprises:
setting a control signal of the set of control signals in response to the first logic output signal and the second logic output signal, the control signal of the set of control signals corresponding to causing the first driver cell to selectively buffer or invert the first output clock.

18. The method of claim 13, wherein the predetermined phase difference is a 180-degree phase difference.

19. The method of claim 12, wherein the set of control signals is independent of the third output clock signal.

20. A clock generating circuit, the circuit comprising:
a first clock tree configured to receive a first clock signal and a second clock signal, to generate a first output clock signal based on the first clock signal and a set of control signals, and to generate a second output clock signal based on the second clock signal and the set of control signals, the first clock signal and the second clock signal having a first predetermined phase difference;
a second clock tree configured to receive a third clock signal and to generate a third output clock signal based on the first clock signal and the third clock signal and the set of control signals, the third clock signal and the first clock signal having a second predetermined phase difference; and
a duty cycle correction circuit configured to receive the first output clock signal and the second output clock signal and to generate the set of control signals based on the first output clock signal and the second output clock signal.

21. The clock generating circuit of claim 20, wherein the duty cycle correction circuit comprises:
a first latch device configured to sample the first output clock signal based on the second output clock signal;
a second latch device configured to sample the first output clock signal based on an inverse of the second output clock signal; and
a control logic circuit configured to receive a first logic output signal from the first latch device and a second logic output signal from the second latch device and, based on the first logic output signal and the second logic output signal, generate the set of control signals.

22. The clock generating circuit of claim 20, wherein the first predetermined phase difference is a 180-degree phase difference.

23. The clock generating circuit of claim 20, wherein the duty cycle correction circuit is further configured to generate the set of control signals independently of the third output clock signal.

* * * * *